US012597894B1

(12) United States Patent
Bonen

(10) Patent No.: US 12,597,894 B1
(45) Date of Patent: Apr. 7, 2026

(54) POWER SAVING IN HFC NETWORKS BY SELECTIVELY REDUCING SPECTRUM UTILIZATION AND BIAS OF A POWER AMPLIFIER

(71) Applicant: Harmonic, Inc., San Jose, CA (US)

(72) Inventor: Adi Bonen, North York (CA)

(73) Assignee: Harmonic, Inc., San Jose, CA (US)

( * ) Notice: Subject to any disclaimer, the term of this patent is extended or adjusted under 35 U.S.C. 154(b) by 342 days.

(21) Appl. No.: 18/387,754

(22) Filed: Nov. 7, 2023

Related U.S. Application Data

(63) Continuation-in-part of application No. 17/592,939, filed on Feb. 4, 2022, now Pat. No. 12,341,481.

(60) Provisional application No. 63/424,825, filed on Nov. 11, 2022.

(51) Int. Cl.
H03F 3/24 (2006.01)
H03F 1/02 (2006.01)
H04N 21/61 (2011.01)

(52) U.S. Cl.
CPC .......... H03F 3/245 (2013.01); H03F 1/0216 (2013.01); H04N 21/6168 (2013.01); H03F 2200/451 (2013.01)

(58) Field of Classification Search
None
See application file for complete search history.

(56) References Cited

U.S. PATENT DOCUMENTS

| | | | | |
|---|---|---|---|---|
| 7,420,421 | B1 | 9/2008 | Lie et al. | |
| 7,443,244 | B2 | 10/2008 | Hagen | |
| 7,593,702 | B1 | 9/2009 | Lie et al. | |
| 8,742,843 | B2 | 6/2014 | Cowley et al. | |
| 8,938,769 | B2 * | 1/2015 | Rakib | H04L 12/2885 |
| | | | | 725/129 |
| 9,191,113 | B1 * | 11/2015 | Rakib | H04H 20/06 |
| 9,735,814 | B1 * | 8/2017 | Jin | H03F 1/3247 |
| 9,887,855 | B2 * | 2/2018 | Rakib | H04L 12/2801 |
| 10,505,499 | B1 | 12/2019 | Bonen | |
| 11,323,306 | B2 * | 5/2022 | Keller | H04L 41/065 |
| 11,949,531 | B2 * | 4/2024 | Yates | H04L 12/2856 |
| 12,041,589 | B2 * | 7/2024 | Sevindik | H04W 72/542 |
| 12,341,481 | B2 * | 6/2025 | Bonen | H03F 3/195 |
| 2014/0184335 | A1 | 7/2014 | Nobbe et al. | |

(Continued)

*Primary Examiner* — Pablo N Tran
(74) *Attorney, Agent, or Firm* — Brokaw Patent Law, PC; Christopher J. Brokaw

(57) ABSTRACT

Selective adjustment of power amplifier bias and spectrum utilization in a broadband network. A CCAP core determines that a set of DOCSIS channels presently operational in the broadband network should be adjusted, either by consulting a schedule of peak-usage or by measuring of a current capacity utilization of the DOCSIS channels presently operational in the broadband network. When the CCAP core determines that the set of DOCSIS channels should be reduced, the CCAP core causes a subset of the DOCSIS channels to turn off at a plurality of power amplifiers throughout the broadband network. When the CCAP core determines that a new operational channel should be added to the set of DOCSIS channels presently operational, the CCAP core causes the new operational channel to turn on at the plurality of power amplifiers throughout the broadband network.

27 Claims, 9 Drawing Sheets

(56) References Cited

U.S. PATENT DOCUMENTS

2015/0180421 A1    6/2015  Balteanu et al.
2025/0309843 A1\*  10/2025  Bonen .................. H03F 1/0272

\* cited by examiner

INTERNET BACKBONE

CCAP CORE 310

BROADBAND NETWORK 320

CABLE MODEMS 330

CONNECTED DEVICES 340

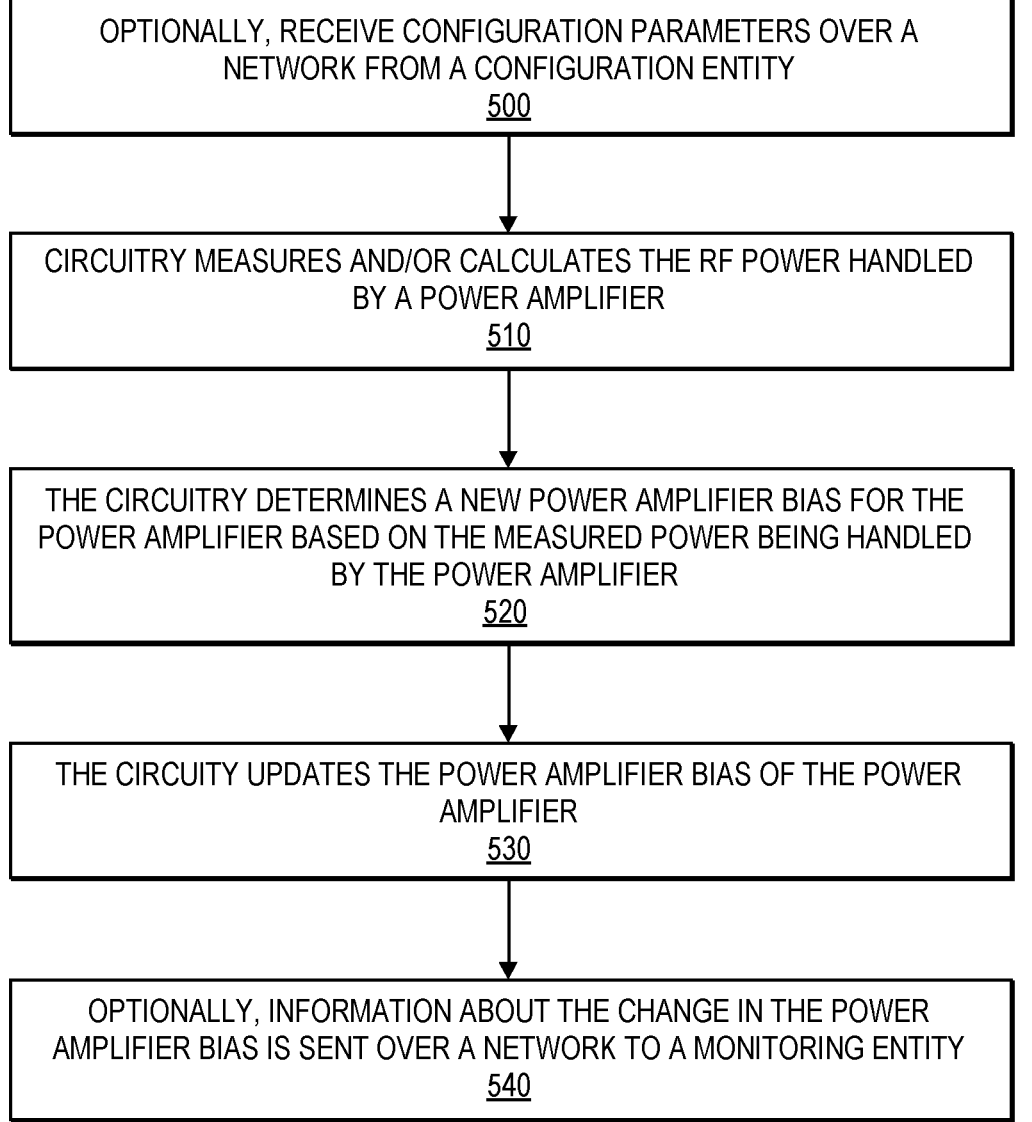

OPTIONALLY, RECEIVE CONFIGURATION PARAMETERS OVER A
NETWORK FROM A CONFIGURATION ENTITY
500

CIRCUITRY MEASURES AND/OR CALCULATES THE RF POWER HANDLED
BY A POWER AMPLIFIER
510

THE CIRCUITRY DETERMINES A NEW POWER AMPLIFIER BIAS FOR THE
POWER AMPLIFIER BASED ON THE MEASURED POWER BEING HANDLED
BY THE POWER AMPLIFIER
520

THE CIRCUITY UPDATES THE POWER AMPLIFIER BIAS OF THE POWER
AMPLIFIER
530

OPTIONALLY, INFORMATION ABOUT THE CHANGE IN THE POWER
AMPLIFIER BIAS IS SENT OVER A NETWORK TO A MONITORING ENTITY
540

FIG. 5

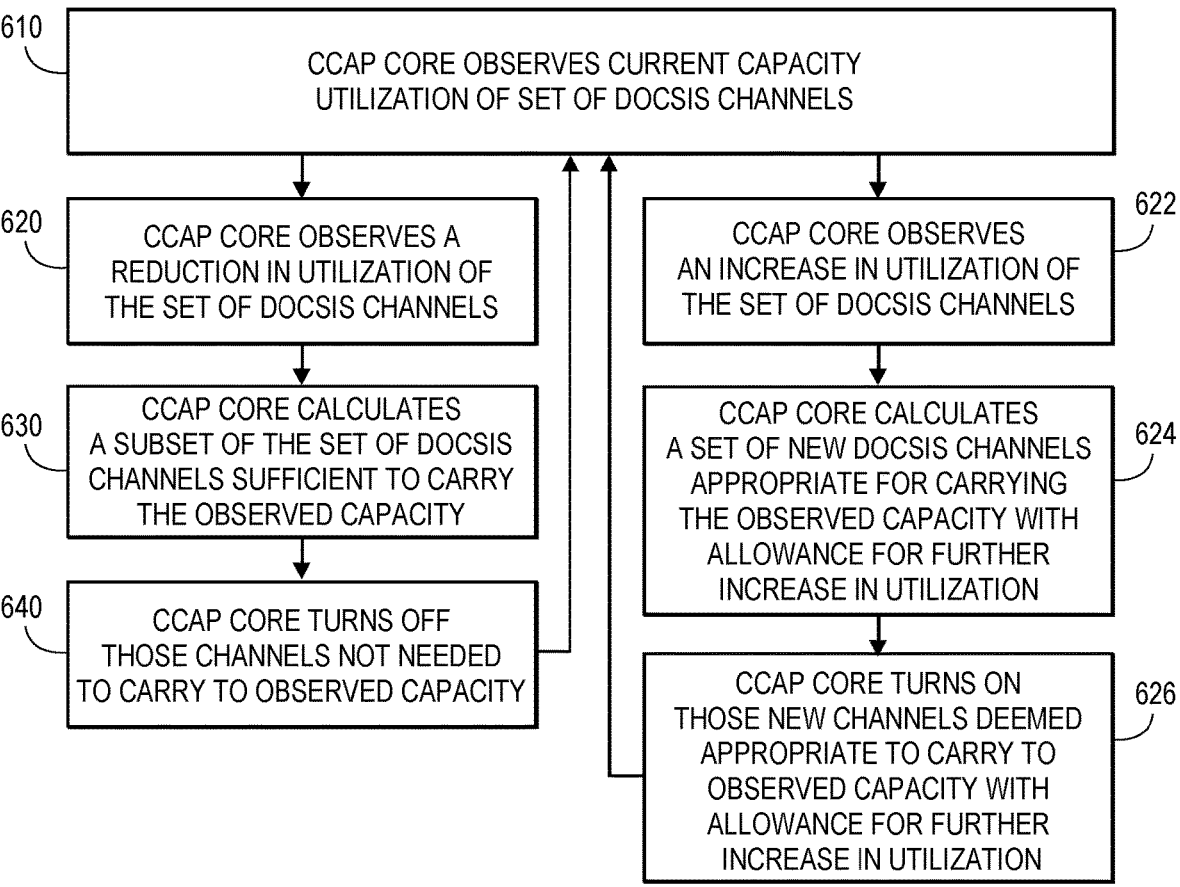

610 — CCAP CORE OBSERVES CURRENT CAPACITY UTILIZATION OF SET OF DOCSIS CHANNELS

620 — CCAP CORE OBSERVES A REDUCTION IN UTILIZATION OF THE SET OF DOCSIS CHANNELS

622 — CCAP CORE OBSERVES AN INCREASE IN UTILIZATION OF THE SET OF DOCSIS CHANNELS

630 — CCAP CORE CALCULATES A SUBSET OF THE SET OF DOCSIS CHANNELS SUFFICIENT TO CARRY THE OBSERVED CAPACITY

624 — CCAP CORE CALCULATES A SET OF NEW DOCSIS CHANNELS APPROPRIATE FOR CARRYING THE OBSERVED CAPACITY WITH ALLOWANCE FOR FURTHER INCREASE IN UTILIZATION

640 — CCAP CORE TURNS OFF THOSE CHANNELS NOT NEEDED TO CARRY TO OBSERVED CAPACITY

626 — CCAP CORE TURNS ON THOSE NEW CHANNELS DEEMED APPROPRIATE TO CARRY TO OBSERVED CAPACITY WITH ALLOWANCE FOR FURTHER INCREASE IN UTILIZATION

FIG. 6

OBSERVE DATA UTILIZATION — 810

RECOGNIZE DATA TRAFFIC PATTERNS, DATA PROTOCOLS, SERVER TARGETS, AND OTHER INDICATIONS THAT FORETELL AN IMMINENT INCREASE IN DATA UTILIZATION — 820

IDENTIFY CABLE MODEM EXPECTED TO REQUIRE ADDITIONAL DATA THROUGHPUT — 830

TURN ON A CHANNEL — 840

ASCERTAIN THAT CABLE MODEM ACQUIRE CHANNEL — 850

START TO USE CHANNEL TO SEND DATA TO CABLE MODEM — 860

POWER SAVING IN HFC NETWORKS BY SELECTIVELY REDUCING SPECTRUM UTILIZATION AND BIAS OF A POWER AMPLIFIER

CLAIM OF PRIORITY

The present application is a continuation-in-part of, and claims priority to, U.S. patent application Ser. No. 17/592,939, entitled Adjustment of Power Amplifier Bias based on Measured Power Level Handled by Power Amplifier, invented by Adi Bonen, filed on Feb. 4, 2022, the disclosure of which is hereby incorporated by reference in its entirety as if fully set forth herein.

The present application also claims priority to U.S. Provisional Patent Application No. 63/424,825, entitled Power Savings in HFC Networks by Reducing Spectrum Utilization and Bias of Power Amplifiers at Off-Peak Hours, invented by Adi Bonen, filed on Nov. 11, 2022, the disclosure of which is hereby incorporated by reference in its entirety as if fully set forth herein.

FIELD OF THE INVENTION

Embodiments of the invention generally relate to the selective adjustment of a power amplifier bias and spectrum utilization during off-peak time in a broadband network.

BACKGROUND

Hybrid Fiber Coax (HFC) is a term that refers to a broadband network based on a combination of optical fiber and coaxial cable. A HFC architecture is often used by cable TV (CATV) operators. In modern cable TV networks, optical fiber is used to transport data between the headend and an optical node deployed in a neighborhood or area of service, while coaxial cable is used to transport data between the optical node and the local houses and locations in the area of service of that optical node.

Over the years, the CATV hybrid Fiber Coax (HFC) architecture has evolved such that the optical node is deployed increasingly closer to the cable customers' premises. Older HFC systems deployed long chains of amplifiers (potentially arranged in a tree structure) between the optical node and cable customers' homes. Over time, amplifier chains have become shorter by segmenting a single long chain of amplifiers to result in multiple smaller chains connected to multiple optical nodes, such that the same area of service previously supported by a single optical node is now serviced by a plurality of optical nodes.

The size of the service domains of an optical node are often quantified not by the length and reach of the coaxial cables, but rather by the number of amplifiers used in the path of the coaxial cable between the optical node and the cable customers. For example, an N+6 deployment signifies that there are up to 6 amplifiers cascaded between the optical node (N) and a customer.

In an amplifier chain, each amplifier typically receives as input a low-level RF signal from the end of a coaxial cable segment, amplifies the received RF signal, and outputs the amplified RF signal onto the next coaxial cable segment. Each such amplifier introduces undesirable noise and distortion to the RF signal. For this reason, shorter amplifier chains generally result in a better signal quality delivered to the cable customer. To enable a longer reach between amplifiers, the power level at the output of each amplifier is increased.

Recently, Fiber Deep (FD) deployments have become popular, as they represent the next stage in evolution of cable networks. In a FD deployment, optical fiber is extended from the cable operator's headend or hub deep into the CATV outside plant, close to the customers' premises, into an optical node that produces RF signals for final distribution over the coaxial network. Another term used to describe this architecture is N+0, where N stands for the optical node and zero signifies that there are no (zero) standalone RF amplifiers between the optical node and the customers' premises. Since there are no additional amplifiers that can degrade the RF signal fidelity, such deployments often use optical nodes with very high output integrated power amplifiers. These High Output (HO) optical nodes are designed to drive the RF signal into a distribution coax network directly (i.e., without being amplified by further amplifiers) into cable subscriber homes. A typical high output FD optical node comprises 4 output ports, each of which is driven by a dedicated high output RF power amplifier.

Due to their strict linearity requirements and large active RF bandwidth, power amplifiers in both Remote PHY optical nodes and Remote MACPHY optical nodes normally operate as Class A amplifiers, rendering them very inefficient. A Class A power amplifier is an amplifier in which the amplifier bias is set such that the amplifier is not driven into its cut-off or saturation regions by the signal it amplifies. Thus, a Class A amplifier exhibits the lowest signal distortion levels and has the highest linearity over the other amplifier classes. This is at the expense of lower power conversion efficiency, which is measured as signal output power divided by the total power consumed by the amplifier.

Although advances in amplifiers have been made over the years, with newer GaN (Gallium Nitride) amplifiers having improved efficiency over prior GaAs (Gallium Arsenide) amplifiers, the typical achievable efficiency of the best high output CATV power amplifiers remains lower than 3.5% at the power amplifier output and less than 2% at the optical node output. The most advanced and highest output power amplifiers presently available consume about 18 W of power to enable about 0.3 W RMS RF power at the output of the optical node. In a typical Remote PHY node having 4 node ports, more than half of the power consumed by the Remote PHY node is consumed by the 4 high output RF power amplifiers for those 4 node ports.

FIG. 1 is an illustration of power amplifier 10 which may be used in the prior art. Many power amplifiers in the prior art allow for lowering the amplifier bias current of power amplifier 10 using adjustable bias current control 12 having a fixed predetermined bias that is established at time of manufacture. Also in the prior art, voltage source 14 may use a lower voltage than is typically used with power amplifier 10. In either case, not only will the power consumed by power amplifier 10 be reduced, but the maximum RF signal power of RF out signal 16 that power amplifier 10 can output without generating significant distortions will also be reduced.

For this reason, when power amplifiers are used in optical nodes which require a lower RF signal power than the maximum capability of the power amplifier, it is standard procedure to design and manufacture the optical node to employ a lower current bias in the power amplifier. The level of the current bias for the power amplifier is adjusted down by design to a level which is just sufficient to support the desired RF signal output power without generating distortions. Doing so enables the power consumption of the power amplifier, and the optical node in which it is installed, to be lowered while still allowing for the output signal to be generated with sufficient fidelity. When such bias adjustment is practiced, it is done during the design and/or manufacturing of the optical node. Consequently, the power consumption of the power amplifier, and thus by extension the maximum power of the RF signal output that the power amplifier can support as part of an optical node, is fixed for the life of the optical node.

U.S. Pat. No. 10,505,499 (the '499 patent), entitled "Power Saving by Configurable Adjustment of Power Amplifier," issued on Dec. 10, 2019, invented by Adi Bonen, discusses various approaches for adjusting the power amplifier bias of a power amplifier based on a configuration of the power amplifier. The '499 patent is hereby incorporated by reference for all purposes in its entirety as if fully set forth herein.

The bias of any power amplifiers comprised within an optical node is adjusted in advance (i.e., during manufacturing) for the worst case (i.e., highest) desirable RF signal output power. Thus, anytime that the optical node is operating at lower RF signal output power, the power amplifier efficiency is lower than what is required at that time, and the optical node consumes higher power than required at that time, thus wasting power.

The RF spectrum at the output of a Remote PHY node (as is the case in other nodes) has a large positive tilt, i.e., higher frequency signals possess higher amplitude and power. This large positive tilt is due to the larger attenuation experienced by higher frequency signals in both coaxial cables and other passive devices used in the cable plant (such as splitters and taps). Since higher frequency signals possess higher power, the higher frequency signals are responsible for most of the power consumed by the power amplifier.

For example, a typical RF spectrum power profile in a Remote PHY node has 22 dB of linear positive tilt across the downstream spectrum from 54 MHz to 1218 MHz. Positive tilt means that higher frequencies have higher power; in this example, the signal occupying the 6 MHz bandwidth near 1218 MHz is 22 dB higher that the 6 MHz bandwidth near 54 MHz. Linear tilt means that a constant power slope is applied across the spectrum between 54 MHz and 1218 MHz, which amounts to an increase of about 1 dB in signal power for frequency increase of 53 MHz.

As a result of the large positive tilt at the output of an optical node, a large amount of the power is concentrated in higher frequencies. In the RF spectrum power profile of the above example, the spectrum portion above 1 GHz, which is less than 20% of the total downstream portion supported by an optical node in this example, contains more than 60% of the total RF power.

Recently, cable deployment has seen quite a few growth steps with respect to the amount of spectrum used. As a result, cable operators normally plan, design, and deploy equipment (including optical nodes) to support higher downstream spectrum capability than can be utilized when the equipment is first deployed. All portions of a cable plant must be capable of higher spectrum utilization before such higher spectrum capability can actually be used. Even when all the cable plant elements of a certain portion of the plan are capable of higher spectrum utilization, it is often not possible to utilize that higher portion of the spectrum due to the desire to have all portions of the cable plant to use the same level of service and channel lineup. As a result, higher frequency utilization may be held back for some time until all portions of the cable plant are upgraded and all the subscribers served by the cable plant can enjoy such advancement.

Consequently, cable equipment (including optical nodes) is typically deployed with maximum limitations enabling higher frequency capability than what it actually carries for several years. Specifically for power amplifiers in an optical node, these power amplifiers are biased to support the fully possible utilization, and thus typically for several years they consume more power than strictly required by the current RF signals they process.

For example, consider FIG. 2, which is a graph depicting a RF spectrum power profile for a Remote PHY node in accordance with the existing state of the art. The RF spectrum power profile shown in FIG. 2 has an active spectrum up to 750 MHz vs. a node capability of RF spectrum up to 1218 MHz with a moderate positive tilt of 16 dB. An optical node deployed to support RF signals up to 1218 MHz may be initially used with RF signal up to typical values such as 750 MHz, 870 MHz or 1002 MHz. During which time the amplifiers consume the power required for RF spectrum up to 1218 MHz. If the amplifier was biased to support RF signals only up to 1002 MHz, about 60% of the power consumed by the amplifier could have been saved, but that would have prevented the node from being used to handle RF signals above 1002 MHz. It is undesirable to have any man-made component consume more power than necessary due at least in part to the impact to the environment and the unnecessary expenditure of financial resources.

BRIEF DESCRIPTION OF THE DRAWINGS

Embodiments of the invention are illustrated by way of example, and not by way of limitation, in the figures of the accompanying drawings and in which like reference numerals refer to similar elements and in which:

FIG. 5 is a flowchart of the functional steps of the adjustment of a power amplifier bias for a power amplifier based on measured levels of power handled by the power amplifier in accordance with an embodiment of the invention;

FIG. 6 is a flowchart of dynamically adjusting which DOCSIS channels in a HFC network are operational for purposes of saving power in accordance with an embodiment of the invention;

DETAILED DESCRIPTION OF THE INVENTION

Approaches for selectively reducing spectrum utilization and bias of a power amplifier are presented herein. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

Physical Description of Embodiments

Approaches are discussed herein for selectively reducing spectrum utilization and bias of a power amplifier. Embodiments may operate to achieve power savings by dynamically adjusting which DOCSIS channels in a HFC network are operational. This adjustment may be performed so that the capacity of the DOCSIS channels is proportional to the present need for data throughput, such that the devices dispersed throughout the HFC network need not consume power to support unneeded capacity. Approaches for expediently turning on a channel in accordance with an embodiment of the invention shall be discussed; however, to be clear, embodiments of the invention will also be discussed for dynamically reducing the number of DOCSIS channels in a HFC network which are operational, and thus, providing a means for obtaining green energy power savings reduction. Moreover, embodiments may favor the use of lower frequency DOCSIS channels when adjusting which DOCSIS channels are operational for purposes of saving power throughout the HFC network.

Figure 1:
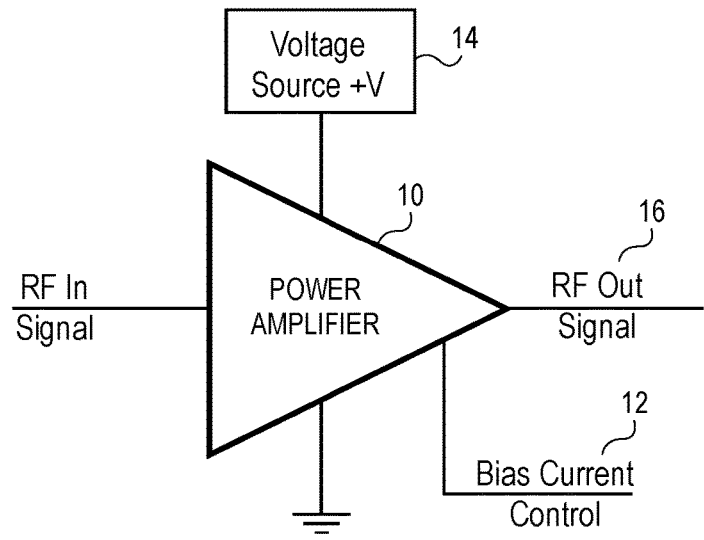
FIG. 1 is an illustration of a power amplifier having an adjustable bias current control according to the prior art.
Figure 2:
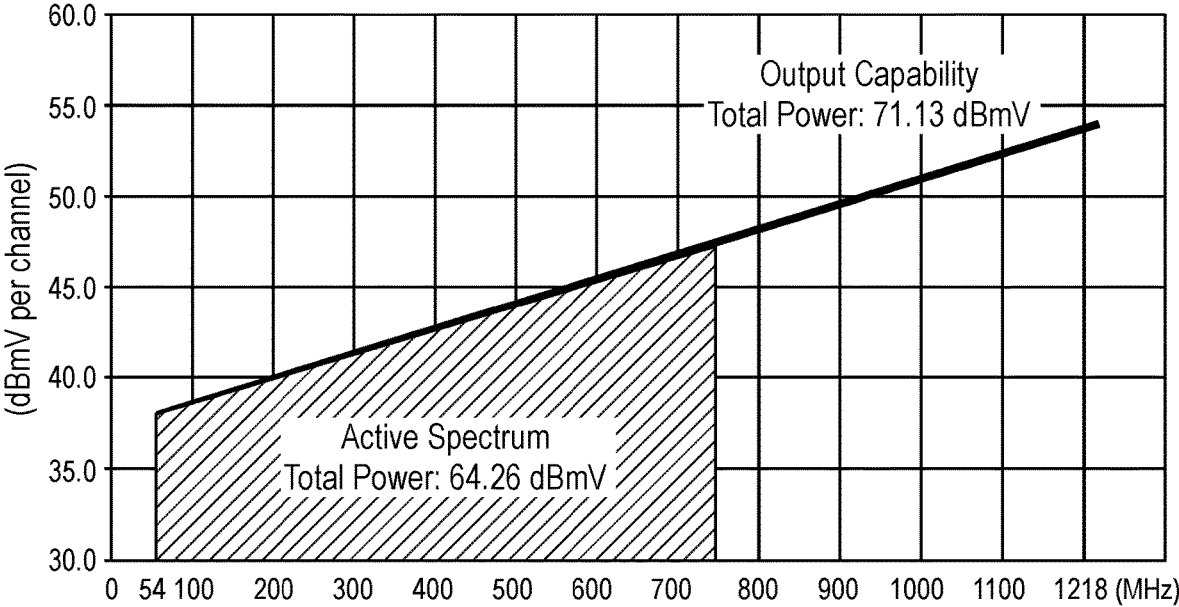
FIG. 2 is a graph depicting a RF spectrum power profile for a Remote PHY node in accordance with the existing state of the art.
Figure 3:
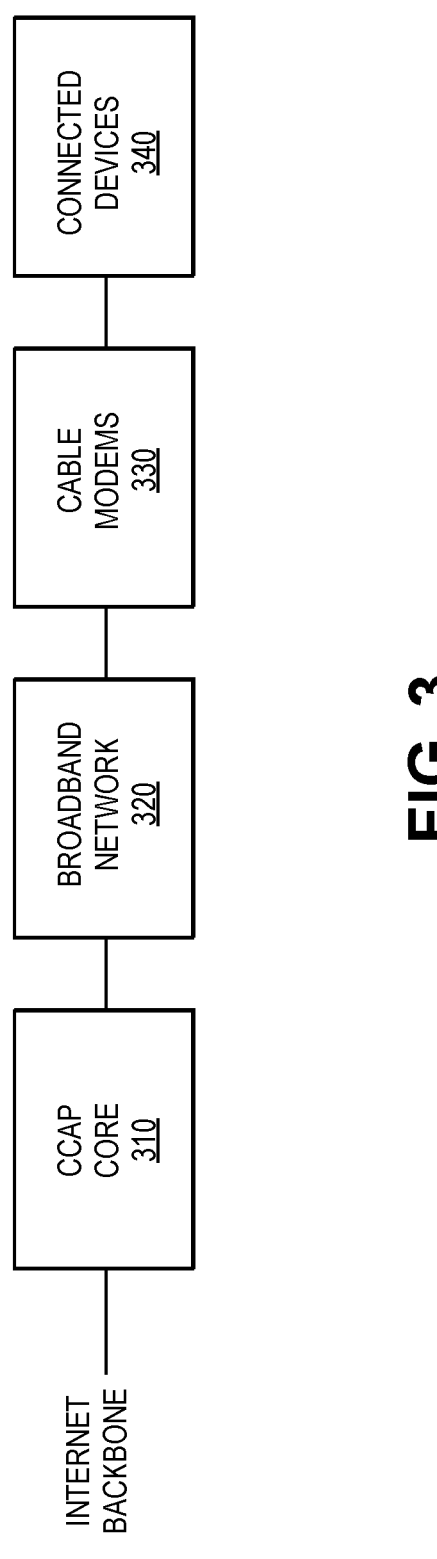
FIG. 3 is a block diagram of a system in accordance with an embodiment of the invention.

Embodiments of the invention operate with broadband networks, such as but not limited to a Hybrid Fiber Coax (HFC) network. FIG. 3 is a block diagram of a system in accordance with an embodiment of the invention. FIG. 3 depicts a Converged Cable Access Platform (CCAP) core 310, a broadband network 320, and a plurality of cable modems 330, connected to a plurality of devices 340 which function require data connectivity. CCAP core 310 represents any software or hardware component capable of issuing instructions to certain components in network 320, such as a node or power amplifier. CCAP core 310 may also assess the data capacity required through network 320 to satisfy the present requirements of cable modems 330 and the connected devices 340 they serve. A non-limiting, illustrative example of CCAP core 310 includes the cOS™ family of products available from Harmonic, Inc. of San Jose, California. Network 320 represent a network, such as a HFC broadband network, over which requested content may be provided to cable modems 330 and various consumer premise devices (CPE) 340 they connect to the Internet.

Approaches will be discussed herein for adjusting of a power amplifier bias for a power amplifier. The adjustment of the power amplifier bias may be performed dynamically based on measured power levels being handled by the power amplifier or in response to an instruction sent by CCAP core 310. Advantageously, the power amplifier bias may be optimized without advanced knowledge of the characteristics of the RF signals handled by the power amplifier to a high degree of precision, which can naturally vary in the years between manufacturing and deployment, let alone between the years spanning the operational lifespan of a power amplifier.

Embodiments of the invention may be used in conjunction with one or more power amplifiers in a variety of different types of apparatuses, including optical nodes (such as a Remote PHY node or a Remote MACPHY node), HFC RF amplifiers, wireless communication devices, cellular communication devices, and satellite devices (such as but not limited to satellite transponders). To provide a concrete example of but a few implementing mechanisms, a description of a particular type of optical node, a Remote PHY node, comprising a power amplifier and two examples of a HFC RF amplifier comprising a power amplifier will be presented.

Figure 4A:
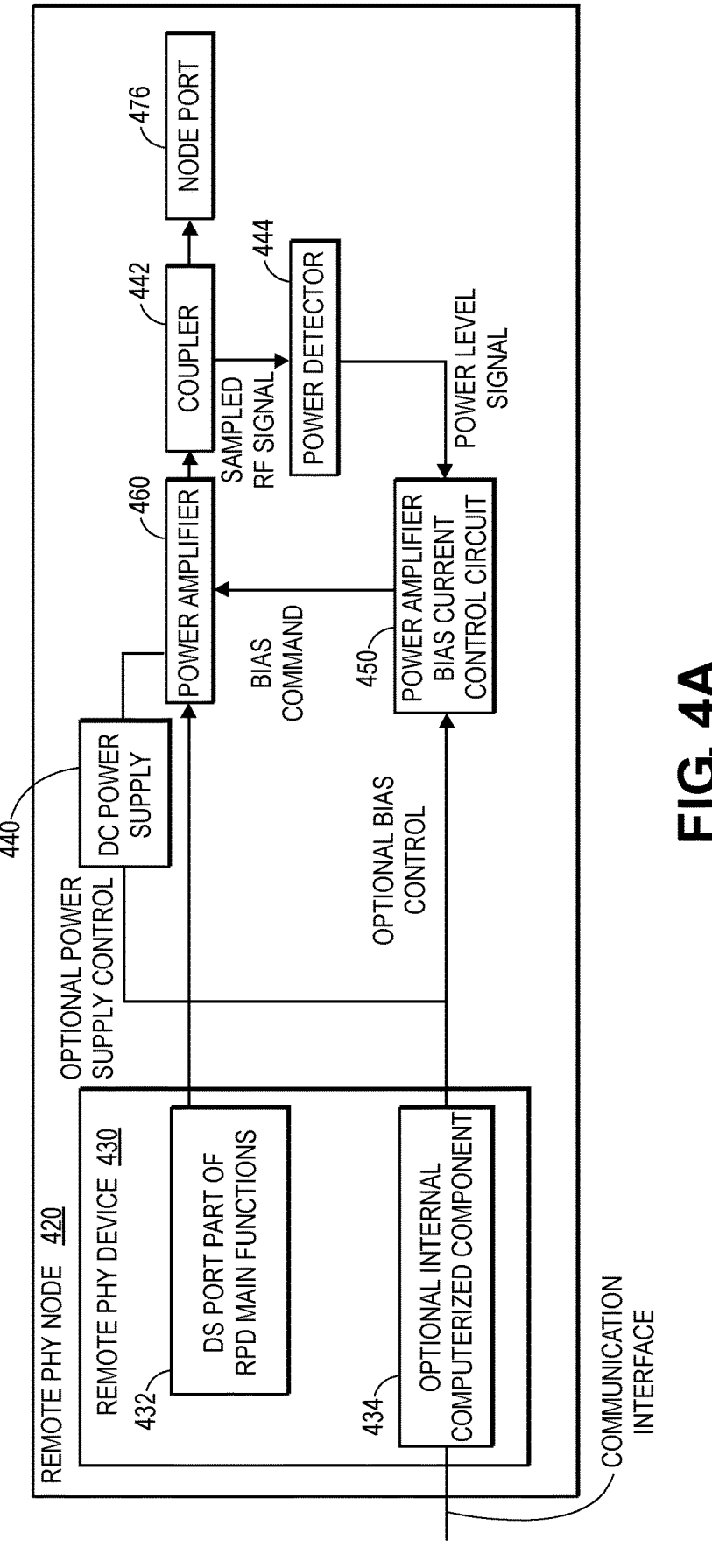
FIG. 4A is a block diagram of a Remote PHY node (RPN) in which an embodiment of the invention may be implemented.

FIG. 4A is a block diagram of a Remote PHY node (RPN) 420 in which an embodiment of the invention may be implemented. The function of RPN 420 is to convert downstream DOCSIS data, MPEG video, and out-of-band (OOB) signals from digital to analog one way and transmit them over a plurality of coaxial cables leading to cable subscribers' homes, and receive upstream data, video, and OOB signals from coaxial cables in analog format and convert them to digital the other way. The digital signals are exchanged between the CCAP Core and Remote PHY Device (RPD) 430, comprised within RPN 420, typically over digital fiber.

Remote PHY nodes, such as RPN 420, are designed to be deployed outdoors near the physical area to be serviced by RPN 420. A non-limiting, illustrative example of RPN 420 includes Harmonic, Inc.'s CableOS™ Ripple+ Remote PHY node. RPN 420 is composed of an outer housing that surrounds at least one power supply 440 and at least one Remote PHY Device (RPD) 430. While only one RPD 430 is depicted in RPN 420 in FIG. 4, other embodiments may employ two or more RPD 430 disposed within a RPN 420. The outer housing of RPN 420 is designed to provide a hermetically sealed environment to the interior of RPN 420. The hermetically sealed environment provided by the outer housing of RPN 420 helps protect internal components such as power supply 440 and RPD 430 from outdoor environmental factors, such as humidity, water, debris, and changes in pressure.

RPD 430 is a device which performs many of the functions involved in converting downstream DOCSIS data, MPEG video, and out-of-band (OOB) signals from digital to analog. These functions are depicted in FIG. 4A as being performed by DS Port Part of RPD main functions 432. RPD 430 may also comprise internal computerized component 434, which is responsible for certain responsibilities discussed herein, such as configurable adjustment of a power amplifier bias for a power amplifier. A non-limiting, illustrative example of Remote RHY device 430 is Harmonic, Inc.'s CableOS™ Pebble-1 Remote PHY device.

Embodiments may, but need not, comprise an optional component referred to as Internal Computerized Component 434. In addition to data transmitted through RPD 430 to and from cable subscribers, and in addition to communications required to fulfill the operation of the DS Port Part of RPD main functions 432, Internal Computerized Component 434 of RPD 430 may send and receive data communications over the optical network (or over a wireless network in contexts where such a network is available). This allows an operator or technician to send and receive data to RPN 420 deployed in the field, such as for purposes of configuring the operation of RPN 420 and/or providing additional or revised data or executable instructions to Internal Computerized Component 434. Internal Computerized Component 434 is optional and need not be present in all embodiments.

Coupler 442, situated at the output of power amplifier 460, passes most of the RF signal power to node port 476, and couples a small portion of the RF signal to power detector 444. The portion of RF coupled by coupled 442 to power detector 444 is proportional to the level of the RF signal at the output of power amplifier 460. Power detector 444 is a component responsible for measuring the power handled by power amplifier 460. The power measured by power detector 444 is used by power amplifier bias current control circuit 450 in ascertaining the desired power amplifier bias for power amplifier 460. In some embodiments, power amplifier bias current control circuit 450 may be implemented in hardware circuitry; in other embodiments, power amplifier bias current control circuit 450 may be performed, at least in part, in software.

Figure 4B:
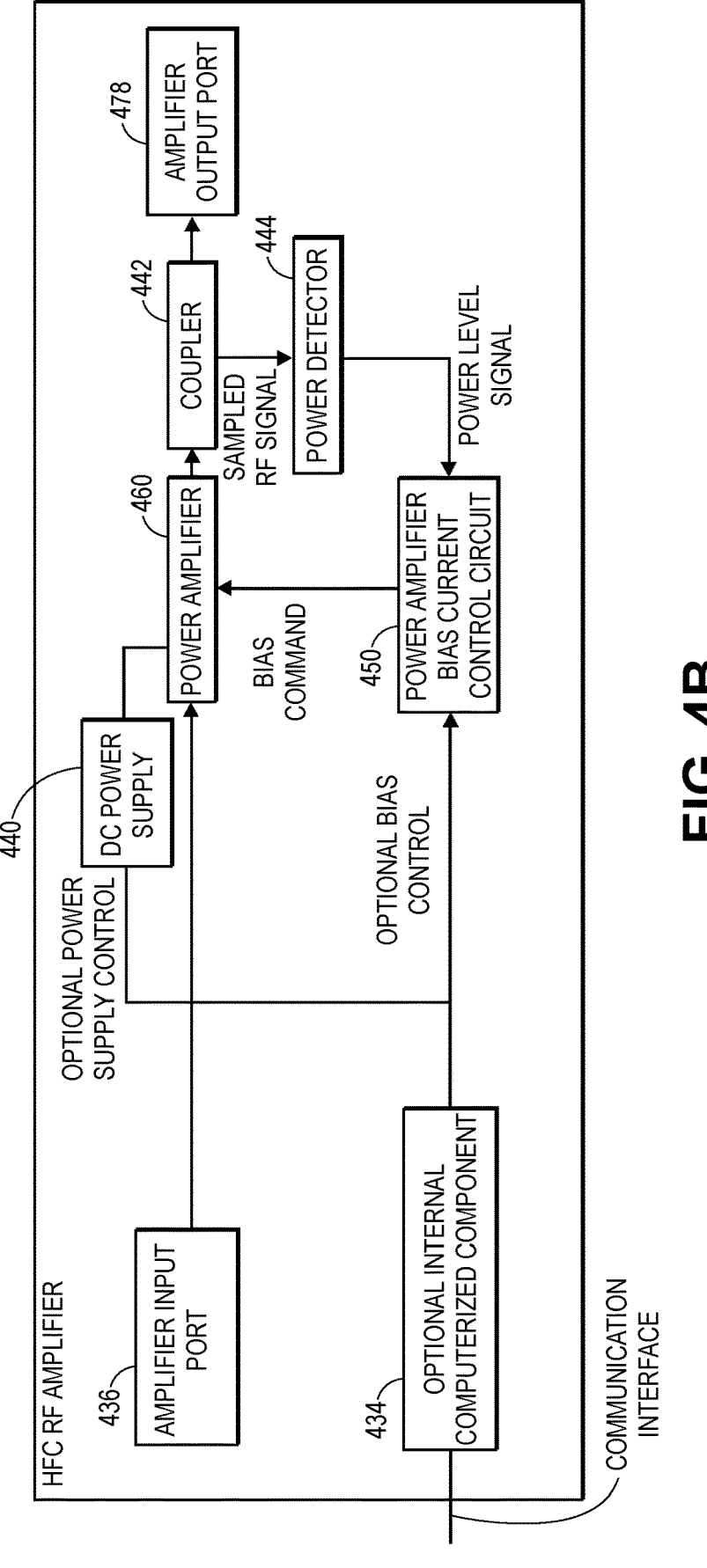
FIG. 4B is a block diagram of an HFC RF amplifier having its power level measured in a first way in accordance with an embodiment of the invention.
Figure 4C:
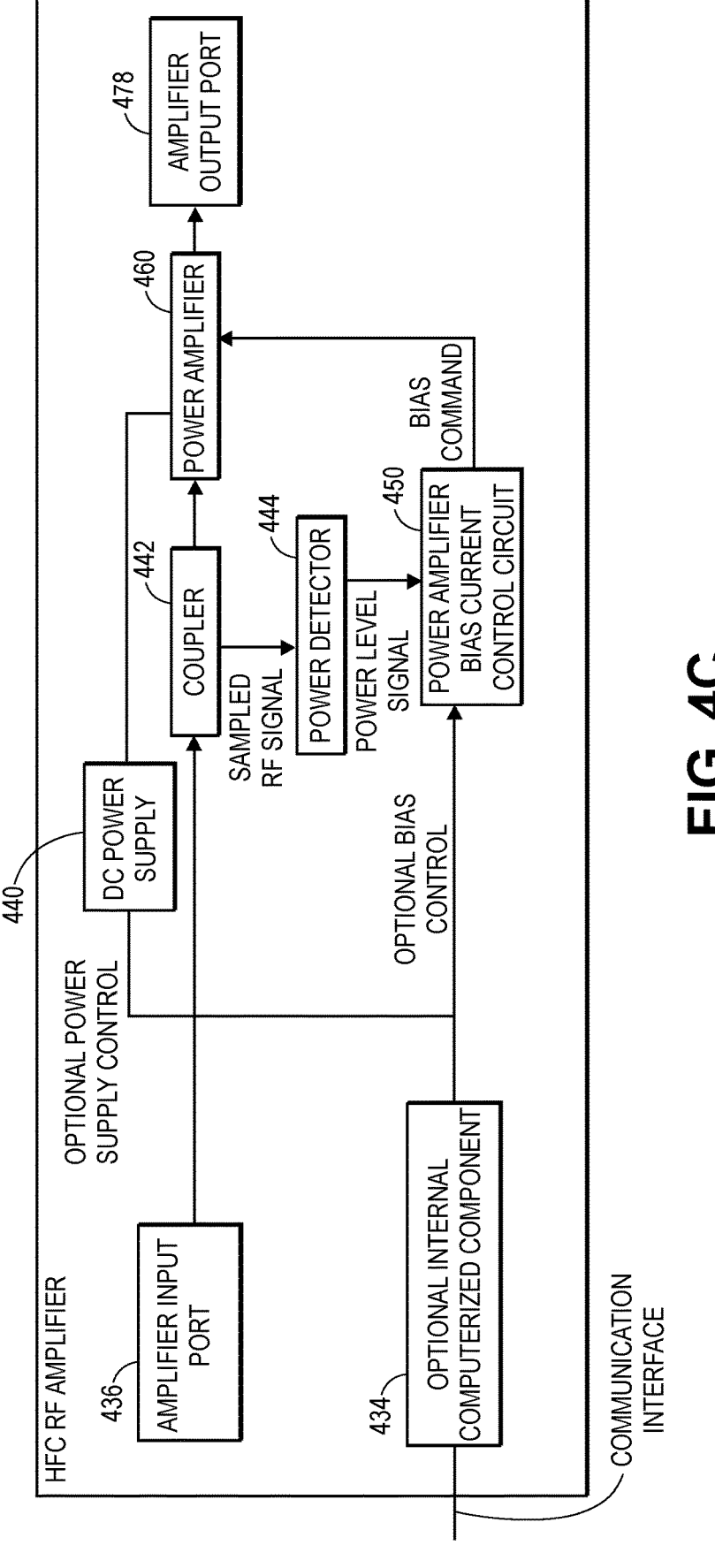
FIG. 4C is a block diagram of an HFC RF amplifier having its power level measured in a second way in accordance with an embodiment of the invention.

Coupler 442 may be deployed in various locations relative to power amplifier 460. To illustrative, consider FIGS. 4B and 4C, which are two block diagrams of a power amplifier having its power level measured by power detector 444 through coupler 442 disposed in different locations in accordance with an embodiment of the invention. Coupler 442 of 4B is disposed after power amplifier 460 in the signal path as the signal propagates to amplifier output port 478, whereas coupler 442 of FIG. 4C is disposed before power amplifier 460 in the signal path as the signal propagates to amplifier output port 478. The embodiments depicted by FIGS. 4B and 4C depict examples other than the technical context of an optical node.

Adjusting Power Amplifier Bias Based on Measured Power

FIG. 5 is a flow chart of the functional steps of the adjustment of the power amplifier bias of a power amplifier based on the measured power level that the power amplifier is handling in accordance with an embodiment of the invention. The steps of FIG. 5 will be explained with reference to components depicted in each of FIGS. 4A-4C.

Step 500 is an optional step that may, but need not, be performed by an embodiment. In step 500, configuration parameters may optionally be received at a physical device over a network from a configuration device. Alternately and/or additional, certain embodiments may optionally store certain configuration parameters at a physical device without transmitting them over a network, e.g., the configuration parameters may be stored at time of manufacture and/or updated by a technician.

The configuration parameters of step 500 may establish when RF signal power measurements are taken, how multiple consecutive measurements are pre-processed (e.g., averaging or low pass filtering), and/or how the measured power is used to adjust the power amplifier bias of the power amplifier. Configuration parameters may be stored in non-volatile memory.

In step 510, circuitry, such as power detector 444, measures and/or calculates the RF power being handled by power amplifier 460 by receiving a proportional sample of the RF power through coupler 442. The time frame over which the RF power is measured is step 510 may be set using prior knowledge of how fast the RF signal power may change and how fast should the power amplifier bias of the power amplifier be adjusted to RF signal power changes. In addition, that time frame may be configurable. For example, the measurement may be performed continuously through the day (such as daytime and nighttime). Embodiments may perform step 510 continuously, applying methods such as sliding window averaging or low-pass-filtering to the measurements; periodically, e.g., every several seconds or several minutes; or at certain configured times.

In step 520, circuitry, such as power amplifier bias control circuit 450, determines a new power amplifier bias for power amplifier 460 based on the measured RF power being handled by power amplifier 460 determined in step 510. The new power amplifier bias should be the power amplifier bias that provides the desired fidelity for the RF power of the signal being processed by the power amplifier 460. In some but not all embodiments, power amplifier bias control circuit 450 may operate by considering data and/or configuration provided by internal computerized component 434 received over a network from a configuration entity and/or saved in non-volatile memory.

In step 530, circuitry, such as power amplifier bias control circuit 450, updates the power amplifier bias of power amplifier 460 determined in step 520.

In optional step 540 periodically, upon a configurable schedule or upon request, information about the change in the power amplifier bias may be sent over a network to a monitoring entity. For example, internal computerized component 434 may transmit data over an optical link to a monitoring device in charge of estimating utility power usage about the bias power applied to power amplifier 460 which can be translated to the power consumed by said power amplifier 460. Non-limiting, illustrative examples of such data that may be sent by internal computerized component 434 over an optical link to a CCAP Core about power amplifier 460 include, without limitation, data about (a) a current power savings associated with the reductions in power amplifier bias from a maximum power amplifier bias associated with power amplifier 460 and (b) an accumulated power savings associated with the reductions in power amplifier bias from a maximum power amplifier bias associated with power amplifier 360.

In embodiments of the invention, the reaction time for changing the power amplifier bias may be faster in one direction than another. Specifically, it may be advantageous to raise the power amplifier bias quickly upon detecting a rise in the RF signal power, as this will minimize the time that lower signal fidelity is present due to insufficient power amplifier bias to handle the higher RF signal power level. In contrast, it may be advantageous to keep the power amplifier bias unchanged for a while upon detecting a decrease in the RF signal power to ensure that the decrease in the RF signal power is not temporary. Only after the new lower RF signal power is confirmed to be stable will it be appropriate to reduce the power amplifier bias.

By adjusting the power amplifier bias based on observation and measurement, it is anticipated that the total cost of ownership of certain advance communication devices such as optical nodes and HFC RF amplifiers embodying the invention may pay for themselves over the lifetime of the advance communication device due to the savings in electricity.

In an embodiment of the invention, power amplifier bias current control circuit 450 is used to control the bias current of power amplifiers 460 in RPN 420. Such control can be fine-tuned with high resolution using a Digital to Analog Converter (DAC).

Means can be provided to a technician located remotely from power amplifier 460 to control and change this RF signal output power capability of power amplifier 460 as needed. Thus, the technician can manually change the bias of power amplifier 460 when higher RF signal power level is expected at node port 470 due to changing the application supported by power amplifier 460 and/or when the spectrum loading carried by power amplifier 460 is configured to support higher frequencies.

In another embodiment, a computerized process may consult a configuration and be employed to dynamically and automatically calculate the minimum bias current and/or the minimum DC supply voltage applied to power amplifier 460. This computerized process may use specific known power amplifier parameters as well as known information about the RF signal power and frequency configured at the output of power amplifier 460. Thus, when a different configuration of node RF signal output power is applied, or when a different RF signal spectrum composition is configured in power amplifier 460, the computerized process will automatically calculate the required bias current and/or DC supply voltage, that when applied to the power amplifier, that power amplifier will produce sufficient signal fidelity at its output, i.e., node port 478.

Note that either the node RF signal output power level or the RF signal spectrum composition of power amplifier 460 may not change often, and power amplifier 460 may operate for several years without any such change applied.

In another embodiment, the configuration and/or computerized process may also consider, and be used to compensate for, known degradation in power amplifier linearity, and thus RF signal fidelity at the output of power amplifier 460, when the power amplifier degradation is associated with changes in the temperature experienced by power amplifier 460. Temperature measurements from a thermal sensor attached to power amplifier 460 may be used to affect the calculation of the required minimum bias current and/or DC supply voltage applied to the power amplifier to ascertain sufficient amplifier linearity and signal fidelity when the temperature changes. Certain techniques that may be used by an embodiment to measure or estimate changes in the temperature experienced by a power amplifier are discussed in U.S. patent application Ser. No. 15/846,926, entitled "Estimated a Lifespan of a Power Supply," invented by Adi Bonen, filed on Dec. 19, 2017, the entire disclosure of which is hereby incorporated by reference for all purposes as if fully set forth herein.

In another embodiment, the configuration and/or computerized process may also consider, and be used to compensate for, other parameters, such as but not limited to, observed power amplifier parameters of power amplifier 460, a determined measure of degradation in power amplifier 460, and on observed environmental affected traits of power amplifier 460.

Embodiments of the invention enable great saving of the DC power required by power amplifier 460, and thus, substantially reduce the power consumption of the apparatus, such as an optical node, when possible.

Embodiments of the invention containing a plurality of output ports driven by a plurality of power amplifiers may adjust the power amplifier bias for each power amplifier in an apparatus independent from the other power amplifier bias for other power amplifier in the apparatus. An independent configuration may be maintained for each power amplifier. Each independent configuration may rely on independent RF signal power measurements in each of the device power amplifiers which bias is being controlled. Alternative embodiments of the invention containing a plurality of output ports driven by a plurality of power amplifiers may adjust the power amplifiers bias of a plurality of power amplifiers based on the RF signal power level measured at just a single power amplifier in the plurality of power amplifiers.

In another embodiment of the invention, the bias current and/or the DC supply voltage that is required to be applied to the power amplifier for the power amplifier to produce sufficient signal fidelity at its output is calculated based on a measurement of the actual RF power handled by the power amplifier. This calculation may use specific known power amplifier parameters.

Selectively Reducing Spectrum Utilization and Bias of a Power Amplifier

The power amplifiers used by optical nodes and HFC RF amplifiers have similar performance constraints, especially in terms of the relation between power consumption and RF power handling capabilities. While embodiments of the invention may be chiefly described using certain examples involving optical nodes, embodiments of the invention can also be used in other contexts, such as but not limited to the power amplifiers in a HFC RF amplifier.

In existing HFC plants neither the node RF signal output power level nor the RF signal spectrum composition at the node are changed often, and a node may operate for several years without any such change applied. When a change is applied to a node, the change is typically for purposes to increase spectrum utilization to a higher active upper frequency. Thus, using some of the approaches discussed herein, an increase of the bias of the power amplifiers and their power consumption may develop over time. A node or an HFC RF amplifier according to an embodiment is expected to save less power after such an increase in spectrum utilization. Specifically, when the HFC spectrum utilization reaches the maximum for which the plant (including the node and HFC RF amplifier) was designed, their power amplifiers will be biased fully, and power is no longer being saved.

Certain embodiments of the invention may operate to achieve power savings even when the HFC spectrum utilization has reached the intended maximum plant capacity. Such embodiments may operate in tandem with other embodiments discussed herein that enable the reduction in power amplifier bias when the combination of channels constituting the RF signal handled by the power amplifier have a reduced combined RF power.

In older days, the channel lineup carried on a CATV HFC plant included mostly dedicated broadcast video channels. Now, modern plants have more and more channels dedicated for transmitting data, voice, and video over DOCSIS. The set of DOCSIS channels used by modern plants to carry network traffic to cable customers has a maximum total throughput. The total throughput of the DOCSIS channel set is typically not fully utilized, and even in peak utilization times, actual throughput rarely reaches 100% of the capacity. Moreover, typical aggregated traffic of the DOCSIS channel set has a daily cyclical pattern, with a peak time period and a valley time period every day. During off-peak times, utilization is often less than 40% of the available capacity, and valley time utilization is often below 20%. Under current schemes, all the channels and spectrum required to convey the peak capacity are configured to the equipment all the time and not reduced when not fully needed during off-peak time.

In an embodiment of the invention, the CCAP core may turn specific DOCSIS channels on or off in according to a fixed schedule on a daily or even weekly basis. This schedule can be based on known patterns of when peak-utilization typically occurs rather than real-time observation of traffic utilization. Using such an embodiment will result in saving power during predicted off-peak times of DOCSIS traffic utilization.

FIG. 6 is a flowchart of dynamically adjusting which DOCSIS channels in a HFC network are operational for purposes of saving power in accordance with an embodiment of the invention. In step 610, the CCAP core observes the current capacity utilization of a set of DOCSIS channels used in the CATV plant. In step 620, the CCAP core observes a reduction in the utilization of the set of DOCSIS channels in the CATV plant. For example, such a reduction is typically observed in off-peak hours, such as overnight when the customer base is sleeping. In response, in step 630, the CCAP core calculates a subset of the DOCSIS channels presently operational that are sufficient to carry that observed capacity. The CCAP core prefers lower frequency channels to be on and higher frequency channels to be off, thus ensuring that the combined RF signal power of a subset of channels is as low as possible given the positive power frequency tilt of the RF signal. Once channels are turned off, a node or HFC RF amplifier system employing an embodiment of the invention will lower the power amplifier bias and lower the consumed power. Thus, power will be saved during off-peak times when DOCSIS traffic utilization is less than maximum.

Thereafter, in step 640, the CCAP core turns off those channels not needed to carry that capacity. When doing so, in an embodiment the CCAP core turns off channels relatively slowly in step 640 in view of the possibility that they may be required in the near future and the ramp-up time necessary when adding a new channel. For example, the CCAP core may turn the subset of DOCSIS channels off after a delay whose length is measured to provide an assurance that the subset of DOCSIS channels no longer need be operational to support a current capacity utilization of the set of DOCSIS channels presently operational. By performing step 640 slowly, a greater assurance is provided that the channel is not required and may be safely turned off in step 640. After the channel(s) are turned off in step 640, processing proceeds back to step 610.

When the CCAP core observes the current capacity utilization of the set of DOCSIS channels presently operational, the CCAP core can determine that the capacity of the currently active channels is lower than the rate of data requested by devices. For example, in step 622, the CCAP core observes an increase in utilization of the set of DOCSIS channels in the CATV plant and/or requested capacity, and thereafter, in step 624, the CCAP core calculates a how many additional DOCSIS channels should be turned on to support that increased requested capacity and allow for further increase in utilization. After the performance of step 624, next in step 626 the CCAP core turns on those new channel(s) deemed appropriate to carry that observed capacity and allow for further increase in utilization. Then, processing proceeds back to step 610.

Embodiments of the invention allows for a new channel to be turned on and become usable (i.e., recognizable by cable modems) in an expedient manner when that channel's capacity is required. To minimize the time required for cable modems to acquire a new channel, each channel that is not intended to be used by embodiments may nevertheless intermediately turned on for brief periods of time so that metadata about the channel is present within the memory of cable modems. In this way, a cable modem can reacquire that channel quicker when it is turned on because certain information about that channel is present within the memory of the cable modem.

Figure 7:
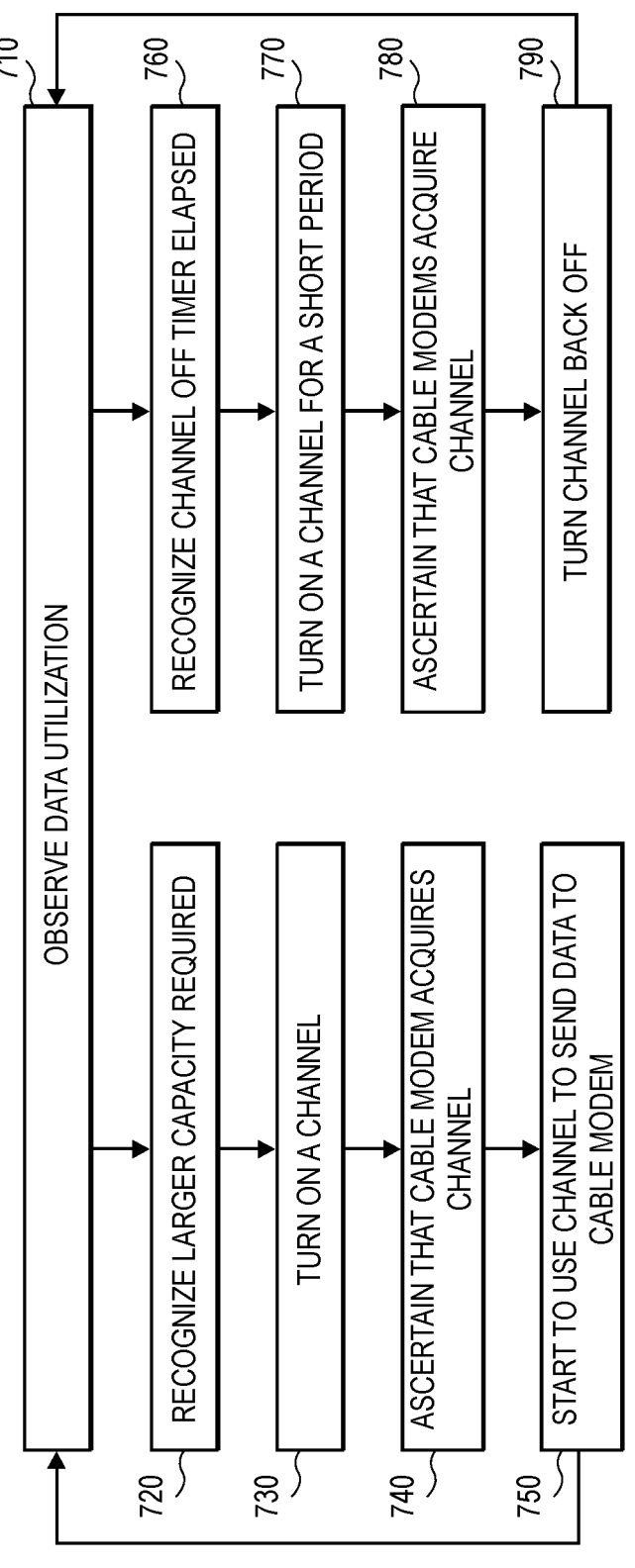
FIG. 7 is a flowchart illustrating the process of assisting a cable modem to acquire a channel faster in accordance with an embodiment of the invention.

FIG. 7 is a flowchart illustrating the process of assisting a cable modem to acquire a channel faster in accordance with an embodiment of the invention. By performing the steps of FIG. 7, the CCAP core may expediently turn on required channels, facilitate their fast acquisition by a cable modem, and enables faster utilization of that channel and faster increase in available data capacity. In step 710, the CCAP core observes the utilization of the set of DOCSIS channels presently operational in the CATV plant.

Thereafter, in step 720, the CCAP core determines that a larger capacity is required. Such a determination may be made based on an evaluation of the observed present use of the channels made in step 710 against the known capacity of the channels presently turned on, or by recognizing patterns hinting of imminent expected data utilization increase. In response, in step 730, the CCAP core instructs one or more components in the broadband network to turn on a channel to support the recognized capacity requirements. In step 740, the CCAP ascertains that the one or more cable modems that require the additional data capacity have acquired the channel. Thereafter, in step 750, the CCAP core begins to use the newly available channel to send data to the one or more cable modems.

The CCAP core of an embodiment may perform actions designed to allow cable modems to acquire a newly turned-on channels in a more expedient manner. For example, in step 760, the CCAP core may maintain a record of how much time has elapsed since a particular channel has been turned on. In this way, the CCAP core may monitor that elapse of time to recognize when a timer indicates a particular channel has been turned off for a certain specified amount of time. In response, in step 770, the CCAP core may turn on that channel for a short period of time then, in step 780, the CCAP core ascertains that select cable modems acquire the channel, and thereafter, in step 790 the CCAP core turns the channel back off again. The purpose of performing steps 760, 770, 780, and 790 is to ensure that recent information about the channel is present within the memory of cable modems. When a cable modem is instructed to begin using a channel, because recent information about that channel is present within the memory of the cable modem, the cable modem may reacquire the channel faster, and begin using the channel more expediently than if such data were not already present in the memory of the cable modem.

The use of a fixed schedule may be used along with the dynamic adjustment discussed above in relation to FIG. 6; thus, while certain embodiments may operate to selectively reduce spectrum utilization and bias of a power amplifier at a node or a HFC RF amplifier using either a fixed schedule or a dynamic adjustment approach, other embodiments may employ both a fixed schedule as well as a dynamic adjustment approach.

Figure 8:
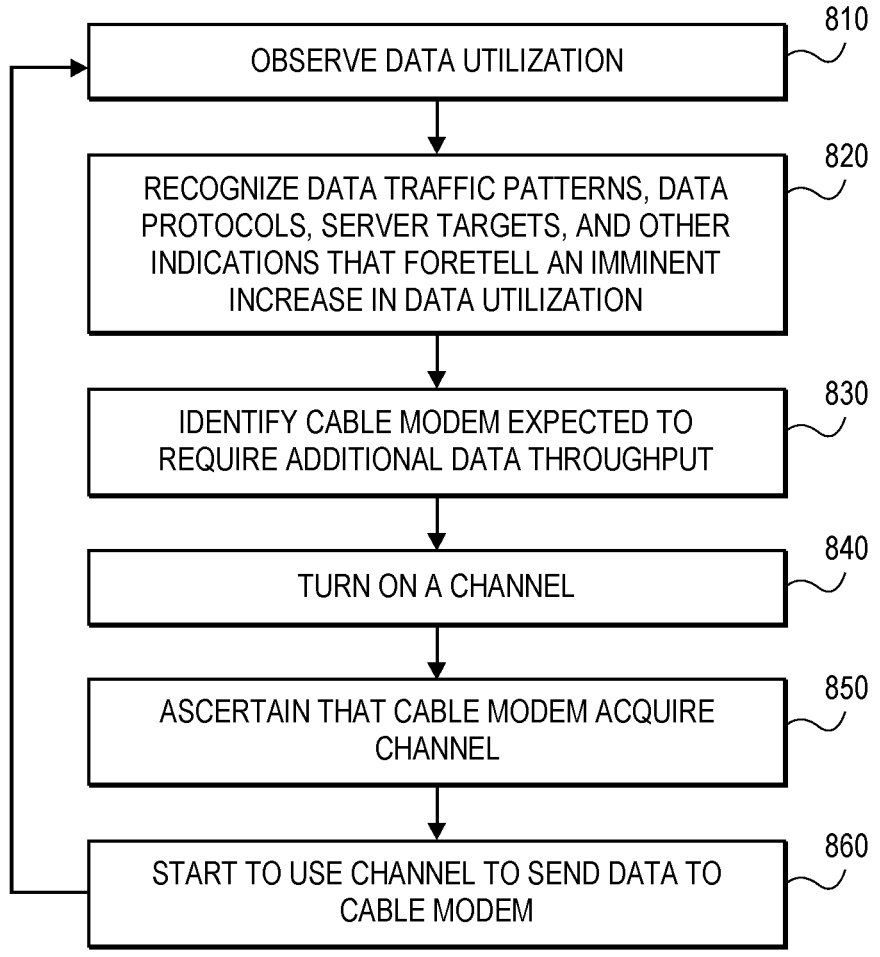
FIG. 8 is a flowchart illustrating the process of the CCAP core identifying an imminent higher data utilization need according to an embodiment of the invention.

FIG. 8 is a flowchart illustrating the process of the CCAP core identifying an imminent higher data utilization need according to an embodiment of the invention As shown in FIG. 8, in step 810, the CCAP core observes data utilization. Then, in step 820, the CCAP core may identify an imminent higher data utilization need by recognizing a data traffic pattern, protocol, a particular server target, and other predetermined indicators. Thereafter, in step 830, the CCAP core may identify the cable modem which will have to handle the additional data utilization. For example, the CCAP core may recognize that a speed test has started at one of the devices served by one of the cable modems, and by that recognize that an imminent increase in data utilization is about to start. In step 840, the CCAP core may prepare for that expected increase in data utilization by turning channels on in advance, and ascertain, in step 850, that the participating cable modem acquired the channel. Once the imminent higher data utilization need has started, in step 860, the CCAP core starts utilizing that newly turned-on channel to send the required additional data to the cable modem.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. One or more non-transitory computer-readable storage mediums for storing one or more sequences of instructions for selective adjustment of a power amplifier bias and spectrum utilization in a broadband network, which when executed, cause:

a Converged Cable Access Platform (CCAP) core determining that a set of Data Over Cable Service Interface Specification (DOCSIS) channels presently operational in the broadband network should be adjusted;

upon a CCAP core determining that the set of DOCSIS channels presently operational should be reduced, the CCAP core (a) determining a subset of DOCSIS channels in the set of DOCSIS channels to turn off and (b) causing the subset of DOCSIS channels to turn off at a plurality of power amplifiers throughout said broadband network; and upon the CCAP core determining that a new operational channel should be added to the set of DOCSIS channels presently operational, the CCAP core (a) determining a set of one or more new DOCSIS channels to turn on and (b) causing the set of one or more new DOCSIS channels to turn on at the plurality of power amplifiers throughout said broadband network.

2. The one or more non-transitory computer-readable storage mediums of claim 1, wherein said CCAP core determining that the set of DOCSIS channels presently operational in the broadband network should be adjusted comprises:

the CCAP core consulting a fixed schedule dictating when channels are operational in said broadband network based on peak-usage of capacity utilization.

3. The one or more non-transitory computer-readable storage mediums of claim 1, wherein said CCAP core determining that the set of DOCSIS channels presently operational in the broadband network should be adjusted comprises:

the CCAP core measuring of a current capacity utilization of the set of DOCSIS channels presently operational in the broadband network;

the CCAP core determining whether the current capacity utilization is deemed appropriate, underutilized, or insufficient;

upon the CCAP core determining that the current capacity utilization is underutilized, the CCAP core determining that the set of DOCSIS channels presently operational in the broadband network should be reduced; and upon the CCAP core determining that the current capacity utilization is insufficient, the CCAP core determining that a new operational channel should be added to the set of DOCSIS channels presently operational.

4. The one or more non-transitory computer-readable storage mediums of claim 1, wherein causing the subset of DOCSIS channels to turn off at said plurality of power amplifiers comprises:

the CCAP core turning the subset of DOCSIS channels off after a delay whose length is measured to provide an assurance that the subset of DOCSIS channels no longer need be operational to support a current capacity utilization of the set of DOCSIS channels presently operational.

5. The one or more non-transitory computer-readable storage mediums of claim 1, wherein causing the set of one or more new DOCSIS channels to turn on at the plurality of power amplifiers throughout said broadband network comprises:

the CCAP core periodically turning on each of said one or more new DOCSIS channels for brief periods of time, when the channel is not needed for additional data throughput to cause recent information about said one or more new DOCSIS channels to be obtained and maintained by cable modems.

6. The one or more non-transitory computer-readable storage mediums of claim 1, wherein said CCAP core determining that the set of DOCSIS channels presently operational in the broadband network should be adjusted comprises:

the CCAP core causing the set of DOCSIS channels presently operational in the broadband network to be adjusted by favoring use of lower frequency DOCSIS channels when possible.

7. The one or more non-transitory computer-readable storage mediums of claim 1, wherein an adjustment in power consumption is experienced at the plurality of power amplifiers throughout said broadband network in response to adjusting the set of DOCSIS channels presently operational in the broadband network.

8. The one or more non-transitory computer-readable storage mediums of claim 1, wherein each of the plurality of power amplifiers are comprised within a Remote PHY node, a Remote MACPHY node, or a HFC RF amplifier.

9. The one or more non-transitory computer-readable storage mediums of claim 1, wherein said CCAP core determining that the set of DOCSIS channels presently operational in the broadband network should be adjusted comprises:

the CCAP core identifying an imminent higher data utilization need by recognizing a data traffic pattern, a protocol, or a server target.

10. An apparatus for selective adjustment of a power amplifier bias and spectrum utilization in a broadband network, comprising:

one or more processors; and one or more non-transitory computer-readable storage medium storing one or more sequences of instructions, which when executed, cause:

a Converged Cable Access Platform (CCAP) core determining that a set of Data Over Cable Service Interface Specification (DOCSIS) channels presently operational in the broadband network should be adjusted;

upon a CCAP core determining that the set of DOCSIS channels presently operational should be reduced, the CCAP core (a) determining a subset of DOCSIS channels in the set of DOCSIS channels to turn off and (b) causing the subset of DOCSIS channels to turn off at a plurality of power amplifiers throughout said broadband network; and upon the CCAP core determining that a new operational channel should be added to the set of DOCSIS channels presently operational, the CCAP core (a) determining a set of one or more new DOCSIS channels to turn on and (b) causing the set of one or more new DOCSIS channels to turn on at the plurality of power amplifiers throughout said broadband network.

11. The apparatus of claim 10, wherein said CCAP core determining that the set of DOCSIS channels presently operational in the broadband network should be adjusted comprises:

the CCAP core consulting a fixed schedule dictating when channels are operational in said broadband network based on peak-usage of capacity utilization.

12. The apparatus of claim 10, wherein said CCAP core determining that the set of DOCSIS channels presently operational in the broadband network should be adjusted comprises:

the CCAP core measuring of a current capacity utilization of the set of DOCSIS channels presently operational in the broadband network;

the CCAP core determining whether the current capacity utilization is deemed appropriate, underutilized, or insufficient;

upon the CCAP core determining that the current capacity utilization is underutilized, the CCAP core determining that the set of DOCSIS channels presently operational in the broadband network should be reduced; and upon the CCAP core determining that the current capacity utilization is insufficient, the CCAP core determining that a new operational channel should be added to the set of DOCSIS channels presently operational.

13. The apparatus of claim 10, wherein causing the subset of DOCSIS channels to turn off at said plurality of power amplifiers comprises:

the CCAP core turning the subset of DOCSIS channels off after a delay whose length is measured to provide an assurance that the subset of DOCSIS channels no longer need be operational to support a current capacity utilization of the set of DOCSIS channels presently operational.

14. The apparatus of claim 10, wherein causing the set of one or more new DOCSIS channels to turn on at the plurality of power amplifiers throughout said broadband network comprises:

the CCAP core periodically turning on each of said one or more new DOCSIS channels for brief periods of time, when the channel is not needed for additional data throughput to cause recent information about said one or more new DOCSIS channels to be obtained and maintained by cable modems.

15. The apparatus of claim 10, wherein said CCAP core determining that the set of DOCSIS channels presently operational in the broadband network should be adjusted comprises:

the CCAP core causing the set of DOCSIS channels presently operational in the broadband network to be adjusted by favoring use of lower frequency DOCSIS channels when possible.

16. The apparatus of claim 10, wherein an adjustment in power consumption is experienced at the plurality of power amplifiers throughout said broadband network in response to adjusting the set of DOCSIS channels presently operational in the broadband network.

17. The apparatus of claim 10, wherein each of the plurality of power amplifiers are comprised within a Remote PHY node, a Remote MACPHY node, or a HFC RF amplifier.

18. The apparatus of claim 10, wherein said CCAP core determining that the set of DOCSIS channels presently operational in the broadband network should be adjusted comprises:

the CCAP core identifying an imminent higher data utilization need by recognizing a data traffic pattern, a protocol, or a server target.

19. A method for selective adjustment of a power amplifier bias and spectrum utilization in a broadband network, comprising:

a Converged Cable Access Platform (CCAP) core determining that a set of Data Over Cable Service Interface Specification (DOCSIS) channels presently operational in the broadband network should be adjusted;

upon a CCAP core determining that the set of DOCSIS channels presently operational should be reduced, the CCAP core (a) determining a subset of DOCSIS channels in the set of DOCSIS channels to turn off and (b) causing the subset of DOCSIS channels to turn off at a plurality of power amplifiers throughout said broadband network; and upon the CCAP core determining that a new operational channel should be added to the set of DOCSIS channels presently operational, the CCAP core (a) determining a set of one or more new DOCSIS channels to turn on and (b) causing the set of one or more new DOCSIS channels to turn on at the plurality of power amplifiers throughout said broadband network.

20. The method of claim 19, wherein said CCAP core determining that the set of DOCSIS channels presently operational in the broadband network should be adjusted comprises:

the CCAP core consulting a fixed schedule dictating when channels are operational in said broadband network based on peak-usage of capacity utilization.

21. The method of claim 19, wherein said CCAP core determining that the set of DOCSIS channels presently operational in the broadband network should be adjusted comprises:

the CCAP core measuring of a current capacity utilization of the set of DOCSIS channels presently operational in the broadband network;

the CCAP core determining whether the current capacity utilization is deemed appropriate, underutilized, or insufficient;

upon the CCAP core determining that the current capacity utilization is underutilized, the CCAP core determining that the set of DOCSIS channels presently operational in the broadband network should be reduced; and upon the CCAP core determining that the current capacity utilization is insufficient, the CCAP core determining that a new operational channel should be added to the set of DOCSIS channels presently operational.

22. The method of claim 19, wherein causing the subset of DOCSIS channels to turn off at said plurality of power amplifiers comprises:

the CCAP core turning the subset of DOCSIS channels off after a delay whose length is measured to provide an assurance that the subset of DOCSIS channels no longer need be operational to support a current capacity utilization of the set of DOCSIS channels presently operational.

23. The method of claim 19, wherein causing the set of one or more new DOCSIS channels to turn on at the plurality of power amplifiers throughout said broadband network comprises:

the CCAP core periodically turning on each of said one or more new DOCSIS channels for brief periods of time, when the channel is not needed for additional data throughput to cause recent information about said one or more new DOCSIS channels to be obtained and maintained by cable modems.

24. The method of claim 19, wherein said CCAP core determining that the set of DOCSIS channels presently operational in the broadband network should be adjusted comprises:

the CCAP core causing the set of DOCSIS channels presently operational in the broadband network to be adjusted by favoring use of lower frequency DOCSIS channels when possible.

25. The method of claim 19, wherein an adjustment in power consumption is experienced at the plurality of power amplifiers throughout said broadband network in response to adjusting the set of DOCSIS channels presently operational in the broadband network.

26. The method of claim 19, wherein each of the plurality of power amplifiers are comprised within a Remote PHY node, a Remote MACPHY node, or a HFC RF amplifier.

27. The method of claim 19, wherein said CCAP core determining that the set of DOCSIS channels presently operational in the broadband network should be adjusted comprises:

the CCAP core identifying an imminent higher data utilization need by recognizing a data traffic pattern, a protocol, or a server target.

\* \* \* \* \*